United States Patent [19]

Shiraiwa et al.

[11] Patent Number: 5,284,412
[45] Date of Patent: Feb. 8, 1994

[54] STOCK UNIT FOR STORING CARRIERS

[75] Inventors: Hirotsugu Shiraiwa, Hino; Takashi Tanahashi, Machida, both of Japan

[73] Assignee: Tokyo Electron Sagami Limited, Kanagawa, Japan

[21] Appl. No.: 740,136

[22] Filed: Aug. 5, 1991

[30] Foreign Application Priority Data

| Aug. 17, 1990 | [JP] | Japan | 2-216911 |
| Aug. 17, 1990 | [JP] | Japan | 2-216912 |
| Aug. 17, 1990 | [JP] | Japan | 2-216913 |

[51] Int. Cl.$^5$ .................................... B65G 1/04
[52] U.S. Cl. ........................ 414/277; 414/940
[58] Field of Search .......... 414/277, 331, 280–282, 414/DIG. 6, 749, 751, 787, 940; 901/33, 34; 198/750, 751, 468.9, 464.3

[56] References Cited

U.S. PATENT DOCUMENTS

| 3,226,833 | 1/1966 | Lemelson | 901/33 X |
| 4,681,504 | 7/1987 | Welch, Sr. | 414/281 X |
| 4,701,096 | 10/1987 | Fisher, Jr. | 414/331 X |
| 4,792,270 | 12/1988 | Yoshida | 414/277 X |
| 4,867,629 | 9/1989 | Iwasawa et al. | 414/331 |
| 4,883,401 | 11/1989 | Kavieff | 414/331 X |
| 4,936,734 | 6/1990 | Osada | 414/787 X |
| 4,950,119 | 8/1990 | Nord et al. | 414/281 X |
| 4,986,715 | 1/1991 | Asakawa | 414/331 |
| 5,011,001 | 4/1991 | Cameron | 198/468.9 X |
| 5,020,958 | 6/1991 | Tuttobene | 414/281 |
| 5,203,445 | 4/1993 | Shiraiwa | 198/464.3 |

FOREIGN PATENT DOCUMENTS

| 153702 | 9/1984 | Japan | 414/331 |
| 56706 | 4/1985 | Japan | 414/280 |
| 137703 | 7/1985 | Japan | 414/331 |
| 161825 | 8/1985 | Japan | 414/331 |
| 242106 | 12/1985 | Japan | 414/331 |
| 136402 | 6/1987 | Japan | 414/277 |

Primary Examiner—David A. Bucci
Attorney, Agent, or Firm—Oblon, Spivak, McClelland, Maier & Neustadt

[57] ABSTRACT

A stock unit for storing carriers has a stock unit body, a plurality of carrier mounting shelves provided in a side wall of the stock unit body at predetermined spaces in a vertical direction, a carrier station, provided in the lower portion of the stock unit body, receiving and sending a carrier between the stock unit and a carrier part provided in the outside of the stock unit body, a carrier transport device, provided in the lower portion of the stock unit body, for transporting the carrier from the inside of the stock unit body to wafer transfer device provided in the outside of the stock unit body, and a carrier arm mechanism gripping at least one carrier, receiving and sending the carrier between the carrier station and the carrier transport device, and between the carrier mounting shelves and the carrier transport device regardless of the operation of the carrier transport device.

8 Claims, 5 Drawing Sheets

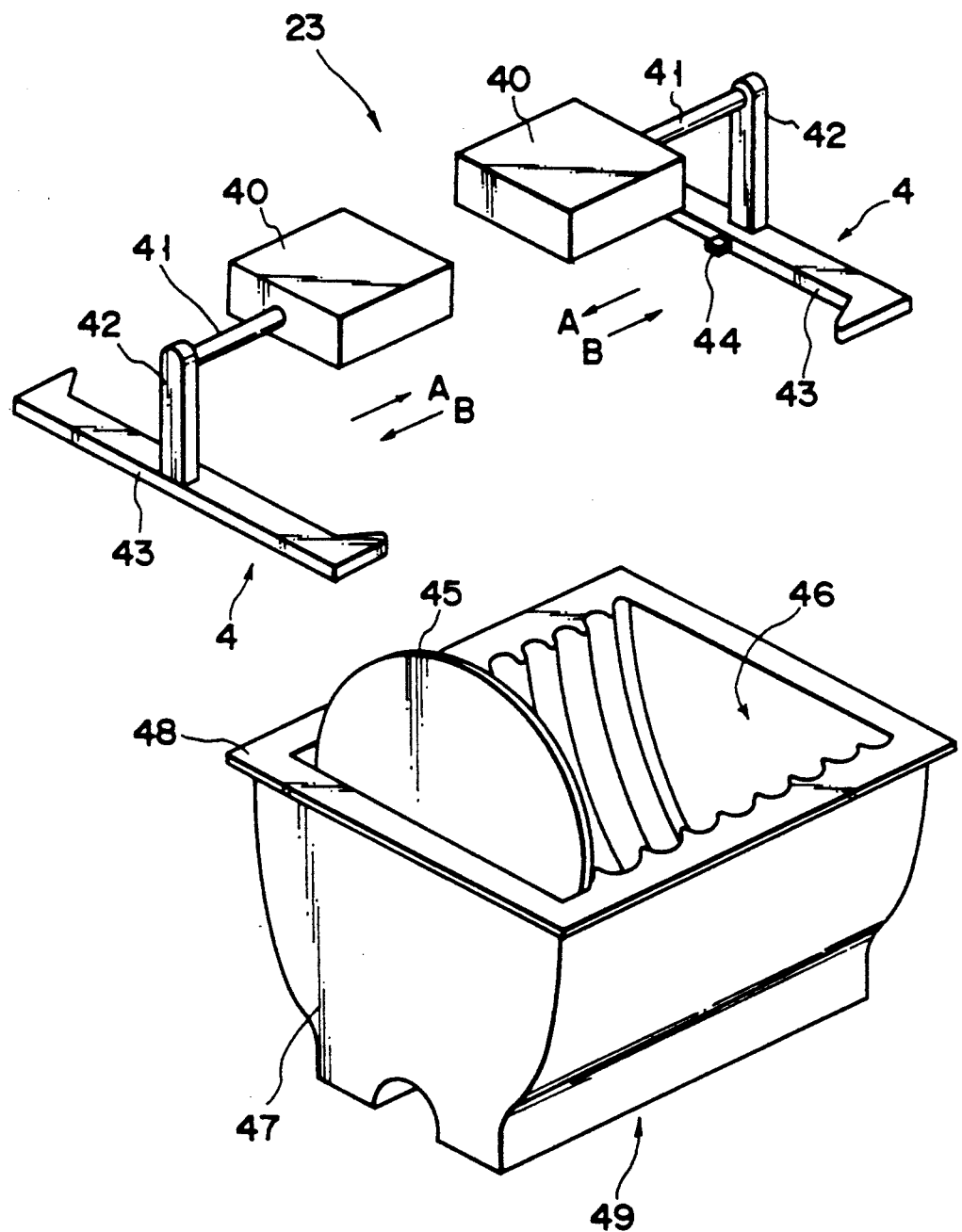
F I G. 2

STOCK UNIT FOR STORING CARRIERS

BACKGROUND OF THE INVENTION

1. Field of the Invention

The present invention relates to stock unit for storing carriers, and more particularly to a stock unit, which can efficiently carry in and out carriers.

2. Description of the Related Art

In conventional, there is used a stock unit for storing carriers, on which objects is disposed, described in Published Unexamined Japanese Patent Application No. 30120.

This type of stock unit comprises a multi-stepped carrier mounting plate on which a carrier is mounted and a carrier holding member, which can go up and down in a vertical direction and move in a horizontal direction. In a case where the carrier is mounted on the carrier mounting plate by use of this type of stock unit, the carrier holding member holds the carrier, and the carrier holding member is lifted up and down in the vertical direction, and moved in the horizontal direction. Thereby, the carrier is transferred to a predetermined carrier mounting plate. The plurality of carriers, which is mounted on the carrier mounting plate, is transported to wafer transfer means by a transport mechanism, and the carriers are transferred to a wafer boat for heat treatment by wafer transfer means.

However, in the conventional stock unit, it is impossible to transport the carriers to be supplied from an exterior at a carrier port while the wafer is transferring to the wafer boat in the transfer between the wafer boat and the carrier. Due to this, time waiting is generated in a part of the function of the carrier transport. For this reason, the carriers stay before the carrier port and throughput deteriorates. Moreover, there is a problem in that flow of carrier transport is stopped in a series of a semiconductor manufacture.

SUMMARY OF THE INVENTION

An object of the present invention is to provide a stock unit for storing carriers wherein carriers do not stay at a carrier port before being transported to the stock unit, flow of the carriers is made better, and throughput can be improved.

The above object can be attained by a stock unit for storing carriers comprising a stock unit body, a plurality of carrier mounting shelves provided in a side wall of the stock unit body at predetermined spaces in a vertical direction, a carrier station, provided in the lower portion of the stock unit body, receiving and sending a carrier between the stock unit body and a carrier port provided in the outside of the stock unit body, a carrier transport plate, provided in the lower portion of the stock unit body, for transporting the carrier from the inside of the stock unit body to wafer transfer means provided in the outside of the stock unit body, and a carrier arm mechanism gripping at least one carrier, receiving and sending the carrier between the carrier station and the carrier transport plate, and between the carrier mounting shelves and the carrier transport plate regardless of the operation of the carrier transport plate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a perspective view showing gripping means of a carrier arm mechanism;

DETAILED DESCRIPTION OF THE PREFERRED EMBODIMENTS

An embodiment of the present invention will be explained with reference to the drawings.

Figure 1:
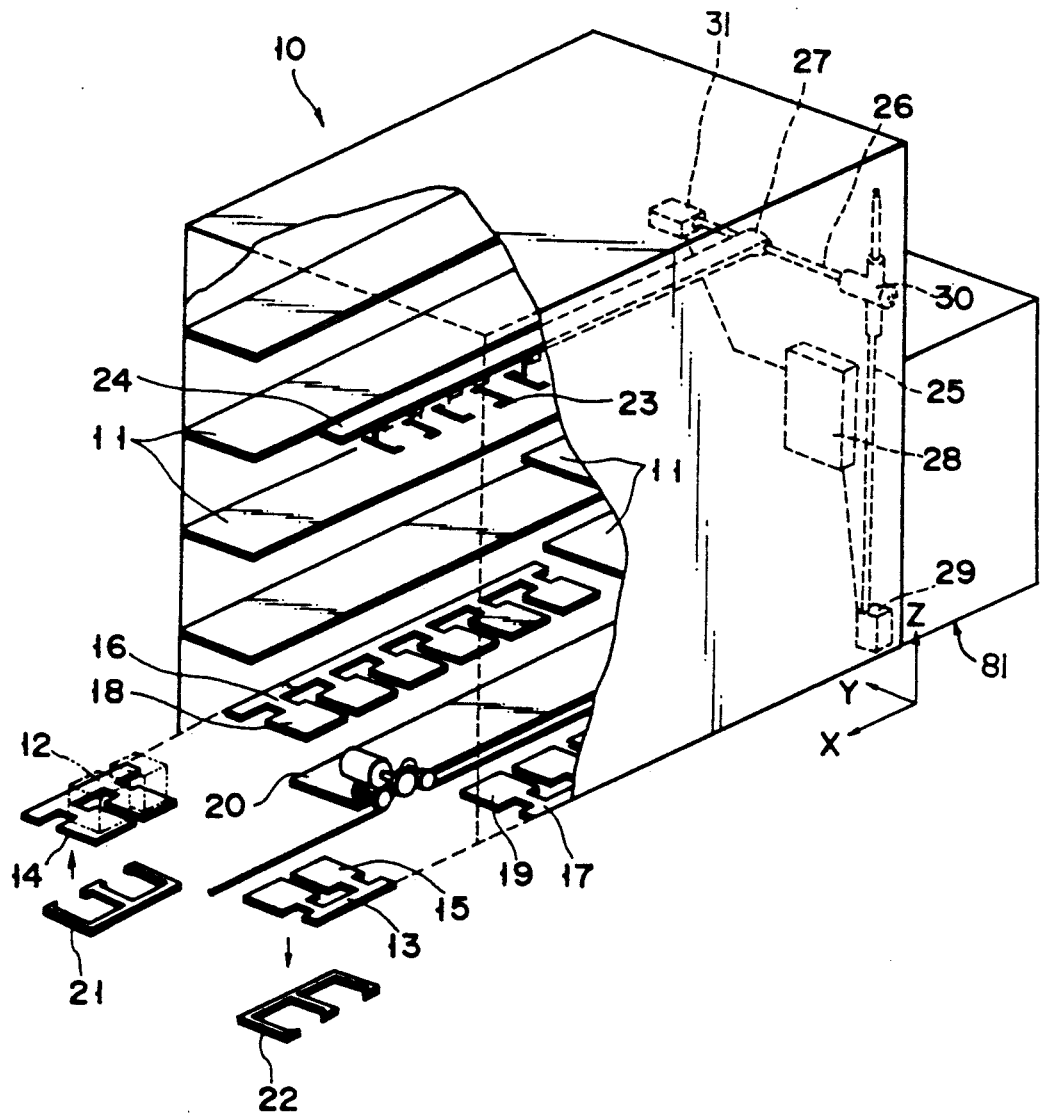
FIG. 1 is a perspective view showing the structure of a stock unit for storing carriers.

FIG. 1 is a perspective view showing the structure of the stock unit.

In the drawing, reference numeral 10 is a stock unit. In the opposing side surfaces in the stock unit 10, there are plurality of shelves 11, for example, four shelves along the longitudinal direction at predetermined spaces in a vertical direction, respectively. In the lower front portion of the stock unit 10, there are provided an IN-side port 12 and an OUT-side port 13. The IN-side port 12 and the OUT-side port 13 are placed to have carrier mounting sections 14 and 15 positioned in the inside thereof.

An IN-side station 16 and an OUT-side station 17 are respectively provided in the lower portion of the shelves 11 provided in both side surfaces of the stock unit 10. Similar to the IN-side port 12 and the OUT-side port 13, the IN-side station 16 and the OUT-side station 17 are placed to have carrier mounting sections 18 and 19 positioned in the inside thereof. Moreover, there are arranged a carrier transport plate 20 between the IN-side station 16 and the OUT-side station 17. The carrier transport plate 20 is movable in a longitudinal direction of the stock unit 10.

In the lower portion of the IN-side port 12, there is provided an IN-side transport device 21 in order to transport carriers from the IN-side port 12 to the IN-side station 16. The IN-side transport device 21 moves from the lower portion of the IN-side port 12 to the vertically upper portion. The IN-side transport device 21 receives the carrier mounted on the IN-side port 12 while being transporting, and moves in a horizontal direction as it is, and stops at the upper portion of the IN-side station 16. Then, the IN-side transport device 21 moves in a vertical lower direction, and mounts the carriers on the carrier mounting section 18 of the IN-side station 16. Thereafter, the IN-side transport device 21 moves in the horizontal direction and returns to the original position. An OUT-side transport device 22, which is provided in opposition to the IN-side transport device 21, performs the operation reverse to the IN-side transport device 21, thereby transporting the carriers from the OUT-side station 17 to the OUT-side port 13.

Moreover, in the stock unit 10, there is provided a carrier arm mechanism 24 having gripping means gripping the carrier, thereby the carriers can be carried onto a desired shelf 11. By use of the carrier arm mechanism 24, gripping means 23 is movable in a Y-axis and a Z-axis directions in the drawing. The carrier arm mechanism 24 comprises a first ball screw 25, a second ball screw 26, an arm 27, a plurality of gripping means 23, and control means 28 for independently controlling the plurality of gripping means 23. The first ball screw 25 is rotated by a first motor 29, thereby the second screw 26, which is connected to a joint section 30, can be moved in a Z direction in the drawing Moreover, by rotating the second ball screw 26 by use of a second motor 31, the arm 27, which is mounted on the second ball screw 26 can be a Y direction in the drawing.

In the lower surface of the arm 27, there are six pairs of gripping means 23 shown in FIG. 2. Each gripping means 23 comprises a pair of gripping bodies 4. Each gripping body 4 comprises an air cylinder 40, a piston 41, a support 42, and a gripping claw 43. The air cylinder 40 is fixed to the lower surface of the arm 27. Moreover, one end of the piston 41 is attached to one side surface of the air cylinder 40, and the piston 41 can be moved in A and B directions in the drawing by controlling air pressure. The other end of the piston 41 is fixed to the support 42, and the end portion of the support 42 is attached to the gripping claw 43. In the inside of the gripping claw 43, there is attached a sensor 44 sensing whether or not the carrier is gripped.

The air cylinder 40 of each gripping body 4 is driven by control means 28. More specifically, in a case where the carrier 49 is gripped, two air cylinders 40 are driven, so that the gripping body 4 is moved in an A direction in the drawing, and the carrier 49 is gripped by each gripping claw 43. A carrier 49, which contains a large number of wafers 45, comprises a carrier body 47 having a carrier containing section 46, and a flange 48, which is provided in the upper end portion of the carrier body 47. Due to this, in a case where the carrier 49 is gripped by the gripping body 4, the lower surface of the flange 48 is gripped by the gripping claw 43. On the other hand, in order to separate the carrier 49 from the gripping claw 43, two air cylinders 40 are driven, so that the gripping body 4 is moved in the B direction in the drawing, and the gripping claw 43 is released from the carrier 49.

As mentioned above, gripping means 23 is independently driven by control means 28. Therefore, it is possible to form the structure in which one gripping means 23 grips the carrier and the other gripping means 23 does not grip the carrier. As a result, arbitrary carriers can be transferred among the IN-side station 16, OUT-side station 17, carrier transport plate 20, and the shelf 11 by an arbitrary number of carriers.

The carrier transport plate 20 shown in FIG. 1 is provided in order that the carrier transport plate 20 can horizontally move between the stock unit 10 and transfer means (not shown). Thereby, the carrier transporting is performed between the stock unit 10 and transfer means.

Figure 3:
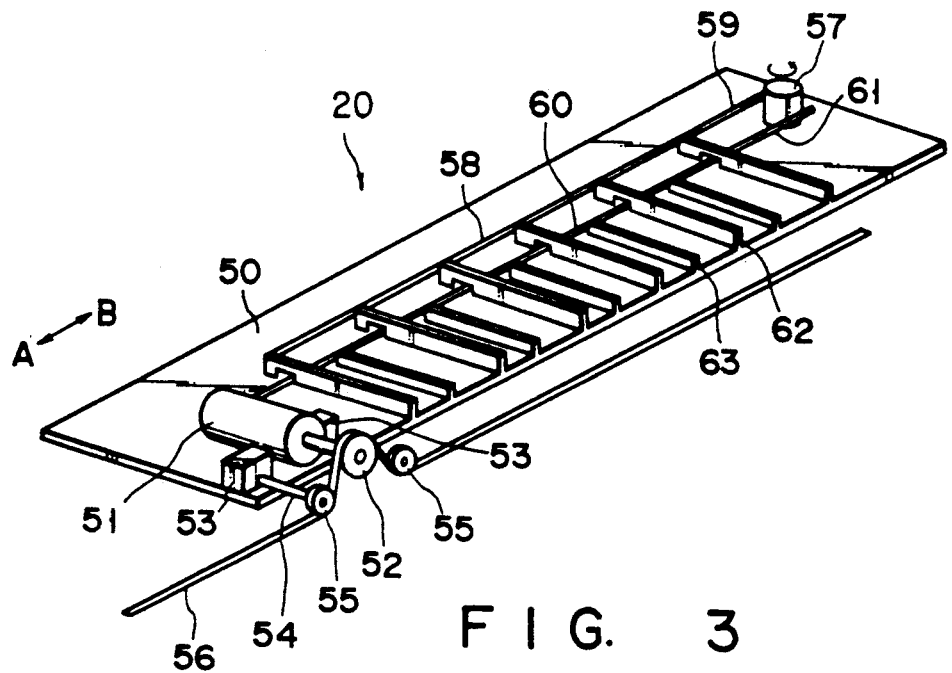
FIG. 3 is a perspective view showing the structure of a carrier transport plate.

FIG. 3 is a perspective view showing the structure of the carrier transport plate. In the drawing, reference numeral 50 is a carrier transport plate body. On the carrier transport plate body 50, there is mounted a motor 51, and a main pulley 52 is attached to a rotation shaft of the motor 51. Moreover, a support 53 is provided in both sides of the motor 51, and an auxiliary pulley 55 is attached to an auxiliary rotation shaft 54 of the support 53. A toothed belt 56, having both ends fixed, is placed on the main pulley 52 and the auxiliary pulley 55. The main pulley 52 prevents the belt 56 from slipping. In the vicinity of the end portion of the opposite side of the motor 51 on the carrier transport plate body 50, there is provided a pinion gear 57, which is driven by a motor (not shown). The pinion gear 57 is engaged with a first rack 59, which is provided in a first rod 58, and a second rack 61, which is provided in a second rod 60. In the first rod 58, there are provided six first holding plates 62 at equal intervals. The first holding plates 62 are slidable in a longitudinal direction of the carrier transport plate body 50. Also, in the second rod 60, there are provided six second holding plates 63 at equal intervals. The second holding plates 63 are slidable in a longitudinal direction of the carrier transport plate body 50. The carrier transport plate 20 is structured as mentioned above. In the above-mentioned structure, since the carrier transport plate body 50 can move in A or B direction in FIG. 3, the carrier transport plate 20 moves in A or B direction by interlocking force between the main pulley 52 and the toothed belt 56 if the motor 51 is driven.

Figure 4:
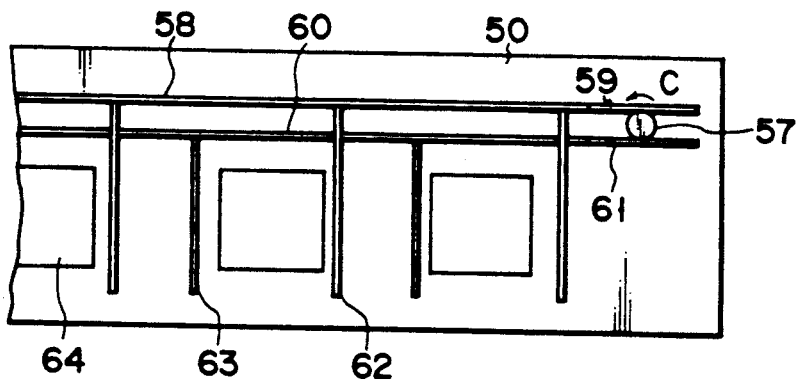
FIGS. 4 and 5 are plane views showing the carrier transport plate.
Figure 5:
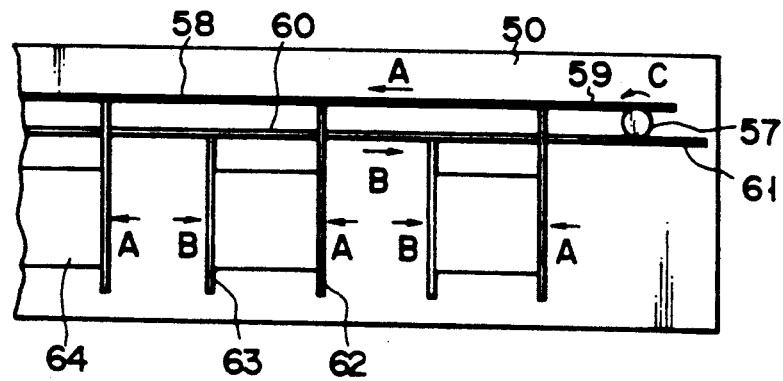

FIGS. 4 and 5 are plane views of the carrier transport plate body 50. The pinion gear 57 is driven by a motor (not shown), and rotates in a C direction in FIG. 4. At this time, the first rod 58 moves in an A direction in FIG. 5, and the second rod 60 moves in a B direction in FIG. 5. In accordance with these movements, the first holding plate 62 moves in A direction, and the second holding plate 63 moves in B direction, thereby a carrier 64 is held between the first holding plate 62 and the second holding plate 63. In this state, the motor 51 is driven, and a carrier transport plate 20 moves.

Since the carrier 64 is held between the first holding plate 62 and the second holding plate 63, the correct positioning of the carrier 64 is performed and the position of the carrier 64 can be prevented from being shifted while the carrier transport plate 20 is transporting.

Figure 6:
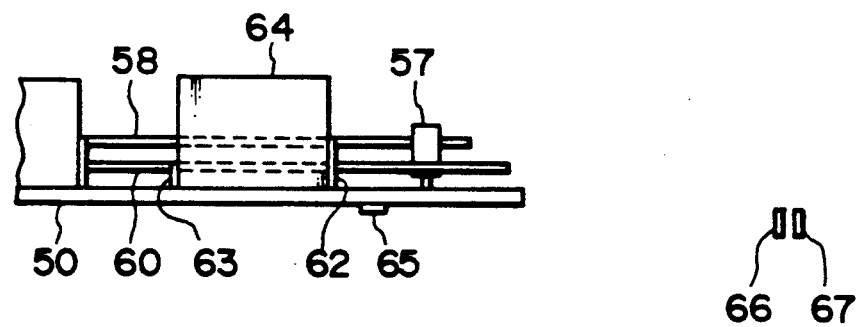
FIG. 6 is a front view showing a main body of the carrier transport plate.
Figure 7:
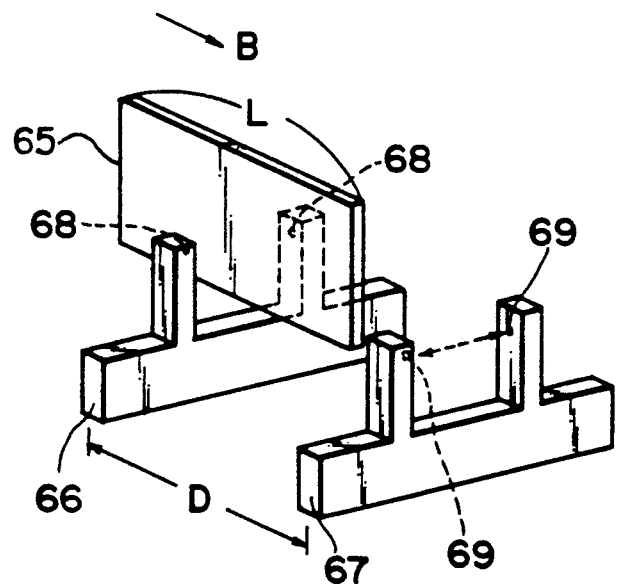
FIG. 7 is perspective view showing the relationship between a first and second sensors and a projection piece.

FIG. 6 is a front view of the carrier transport plate body 50. In the lower surface of the carrier transport plate body 50, there is provided a projection piece 65. Also, in the outside of the carrier transport plate body 50, there are provided a first sensor 66 and a second sensor 67. FIG. 7 is a perspective view showing the relationship among the first sensor 66, the second sensor 67, and the projection piece 65. In the first sensor 66 and the second sensor 67, there are provided optical sensors 68 and 69, respectively. The first sensor 66 and the second sensor 67 are placed to be separated from each other by a distance D. Due to this, a length L of the projection piece 65 is set to be a little longer than the distance D.

While the carrier transport plate is moving in a B direction in FIG. 7, the carrier transport plate stops the instant that the projection piece 65 crosses the second sensor 67 and interrupts light in the optical sensor 69. At this time, since the length L of the projection piece 65 is a little longer than the distance D, the projection piece 65 simultaneously interrupts light in the optical sensor 68 in the first sensor 66. Therefore, the carrier transport plate stops at the time when the projection piece 65 interrupts light in the optical sensor 68 and light in the optical sensor 69 at the same time. In a case where the carrier transport plate does not stop at a desired position or the position of the carrier transport plate is shifted by external force after the carrier transport plate 5 stops at the desired position, either the first sensor 66 and/or the second sensor 67, do not sense the projection piece 63. Due to this, even if backlash between the toothed belt 56 and the main pulley 52 is large and elongation occurs in the toothed belt 56 after being used for a long time, the carrier transport plate can be correctly stopped at the desired position. Also, it can be detected that no shift of position occurs after the carrier transport plate is stopped.

Note that the distance D between the first sensor 66 and the second sensor 67 can be controlled by changing the attaching position of each sensor, and the object stopping position and the tolerance of the shifted position can be controlled.

In the above-explanation, there is explained a motor (not shown), which drives the pinion gear 57, other than the motor 51. However, both pinion gear 57 and main pulley 52 may be driven with one motor by using clutch means. Moreover, the above-explanation was based on the point that the carrier was transported. However, it is possible to transport a boat by this transporting mechanism. In this case, one first holding plate 62 and one second holding plate 63 are provided on the transport plate body, and the boat is held by these plates.

Then, the above transport mechanism is enclosed with a protection member, the interior of the protection member is exhausted to negative pressure. Thereby, it is possible to prevent dust from flying onto the carrier. Also, according to the above transport mechanism, it is possible to transport the carrier for a long distance by use of longer belt. Moreover, according to the above transport mechanism, since only one belt 56 may be used, the size of the apparatus can be miniaturized.

The movement of the carrier in the stock unit will be explained with reference to FIG. 1.

In a case where the carrier containing the wafer is transported to the IN-side port 12, the carrier is moved by the IN-side transport device 21, and mounted on the IN-side station 16. Since the IN-side transport device 21 can transport two carriers at the same time, six carriers can be mounted on the IN-side station 16 by repeating this operation three times. Thereafter, the first ball screw 25 is driven by the first motor 29 and the second ball screw 26 is driven by the second motor 31. Thereby, the arm 27 is moved in the upper and lower direction and the horizontal direction, and positioned in the upper portion of the IN-side station 16. Then, the arm 27 is lowered, and the flange of the carrier is gripped by two gripping claws 43. If the carrier is gripped, a sensing section of gripping means is pressed and an electric signal is generated from the sensor. The electric signal is sent to control means 28, and it is confirmed that the carrier is gripped. In this case, six carriers can be gripped at the same time by the carrier arm mechanism 24.

If the carrier is gripped by the gripping claw 43, the first ball screw 25 and the second ball screw 26 are driven as mentioned above, the arm 27 is moved to the upper portion of the predetermined shelf 11. Thereafter, the carrier is lowered. Then, the gripping claw 43 is opened to release the carrier, and the carrier is mounted on the shelf 11. In this case, one predetermined gripping means of six gripping means of the carrier mechanism 24 can be set to be in a carrier release state, and the other gripping means can be set to be in a carrier holding state. Similar to the abovementioned operation, by use of the carrier arm mechanism 24, a predetermined number of carrier can be carried between the IN-side station 16 and the carrier transport plate 20, between the shelf 11 and the carrier transport plate 20, between the OUT-side station 17 and the carrier transport plate 20, and between the OUT-side station 17 and the shelf 11. Also, the carrier containing the wafer, in which the heat treatment is finished, can be mounted on the predetermined shelf 11 by the carrier arm mechanism 24 in the similar manner as mentioned above.

Figure 8:
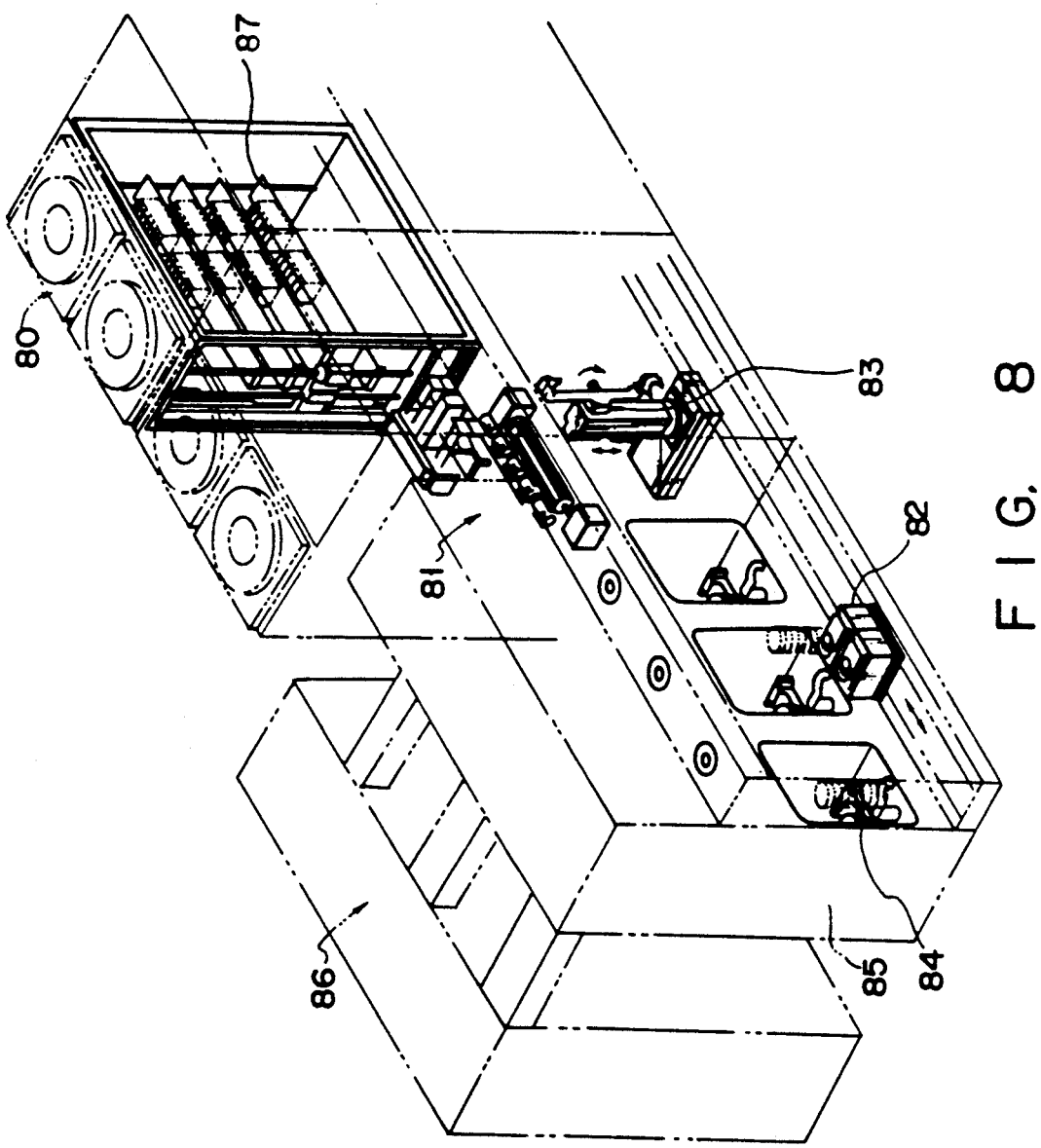
FIG. 8 is a schematic view showing a heat treatment system having the stock unit.

FIG. 8 is a perspective view showing the general structure of a treatment system having the stock unit of the present invention. The treatment system comprises a stock unit 80 containing a large number of wafer carrier having an objects, for example, twenty-five semiconductor wafers, transfer means 81, boat transport means 82, boat transfer means 83, a boat elevator 84, a reaction furnace 85, and a gas supply source 86.

In transfer means 81, the wafers are automatically transferred from the carrier, which is transported from the stock unit 80 and has twenty-five semiconductor wafers, to a heat-stable quartz wafer boat, on which 100 to 150 wafers can be mounted, by use of a robot arm on the basis of the program. In boat transfer means 83, the wafer boat is transported to one heat treatment furnace of a plurality of heat treatment furnaces in programmed order. In the boat elevator 84, the wafer boat, which was transported by boat transport means 82, is loaded and unloaded in a reaction tube of the reaction furnace 85. In the reaction furnace 85, a predetermined oxidation, diffusion, CVD treatment are performed. In the gas supply source 86, predetermined treatment gas is supplied into the reaction tube of the reaction furnace 85. In the stock unit 80, transfer means 81, boat transfer means 83, and boat transport means 82, there are provided a blowing fan, an HEPA filter, and an exhaust fan in order to supply clean air in a down flow manner.

In the above-structured system, the carrier transport plate 87, on which, for example, six carriers are mounted, moves in the horizontal direction and transports the carriers to transfer means 81. Thereafter, the wafers are transferred to the wafer boat by transfer means 81. Further, the direction of the wafer boat is changed by boat transfer means 83, and the wafer boat is transferred to boat transport means 82 by boat transfer means 83. Sequentially, the wafer boat is transported to the reaction furnace 85 by boat transport means 82. The wafer boat is loaded in the reaction tube by the boat elevator 84, thereby the wafers are arranged in a treatment zone. In the above-mentioned state, treatment gas is supplied into the reaction tube from the gas supply source 86, thereby heat treatment is performed.

The wafers in which heat treatment is finished are taken out of the lower portion of the reaction tube of the reaction furnace 85 by lowering the boat elevator 84, and transferred to the boat transport means 82. Moreover, the direction of the wafer boat is changed by boat transfer means 83, and the wafers in the wafer boat are taken up and contained in the carrier by use of transfer means 81. The carrier is mounted on the carrier transport plate and moved to the IN-side of the stock unit 80. Thereafter, the carrier, which is mounted on the carrier transport plate, is mounted on the OUT-side station, and moved to the OUT-side port by the OUT-side transport device.

The above explanation referred to the heat treatment. However, the present invention can be applied to the treatment such as etching, coating, ion implantation.

In the treatment system, since a plurality of the reaction furnaces is provided, the wafers are transferred from the carrier to the wafer boat or from the wafer boat to the carrier by transfer means. On the other hand, the carrier in which untreated wafers were contained was carried from the IN-side port in the stock unit, and the carrier in which treated wafers were contained was carried out from the stock unit to the OUT-side port. Therefore, it is possible to prevent the carrie from staying at the IN-side port and the OUT-side port. Particularly, since desired carriers can be moved by a predetermined number, the carriers can be treated and transported efficiently.

According to the present invention, by use of the carrier arm mechanism, the carrier is received and sent among the carrier station, the carrier transport plate and the carrier mounting shelf regardless of the movement of the carrier transport plate. Due to this, both transferring the carrier from the carrier port to the carrier station and transporting the carrier to transfer means using the carrier transport plate can be performed at the same time.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A stock unit for storing carriers comprising:
   a stock unit body;
   a plurality of carrier mounting shelves provided in a side wall of said stock unit body at predetermined spaces in a vertical direction;
   at least two carrier stations, provided in a lower portion of said stock unit body, for mounting a plurality of carriers;
   carrier moving means for moving said carriers from a carrier port to said carrier stations;
   carrier transport means, provided in the lower portion of said stock unit body, for transporting said carriers from an inside of said stock unit body to wafer transfer means provided in an outside of said stock unit body; and
   a carrier arm mechanism for gripping at least one carrier and for receiving an sending said carrier between said carrier stations and said carrier transport means and between said carrier mounting shelves and said carrier transport means.

2. The stock unit according to claim 1, wherein said carrier arm mechanism has an arm movable in a horizontal direction and a vertical direction, and a plurality of gripping means, formed in the lower surface of said arm, for independently gripping said carrier.

3. The stock unit according to claim 2, wherein said gripping means has a sensor for sensing that said carrier is gripped.

4. The stock unit according to claim 2, wherein said gripping means is formed of two gripping bodies having a gripping claw, a support for supporting said gripping claw, a piston attached to said support, and an air cylinder for driving said piston, and said gripping claw gripping the carrier by driving said air cylinder.

5. The stock unit according to claim 2, wherein said carrier transport means comprises a transport body for mounting said carrier, driving means attached to said transport body, and a belt driven by said driving means, and said transport body being moved by driving said belt.

6. The stock unit according to claim 5, wherein a position of said transport body is sensed by a sensor and said transport body is stopped at a desired position.

7. The stock unit according to claim 1, wherein said carrier moving means comprises means for moving a carrier holding section from a lower side of said carrier port, holding said carrier mounted on said carrier port on said carrier holding section, moving up said carrier, thereafter horizontally moving said carrier holding section to the position of said carrier station, moving down said carrier from an upper portion of said carrier station, and mounting said carrier on said carrier station.

8. The stock unit according to claim 1, wherein the operation of said carrier arm mechanism is controlled regardless of the operation of said carrier transport means.

* * * * *